(12) United States Patent
Ruf

(10) Patent No.: US 6,649,441 B2
(45) Date of Patent: Nov. 18, 2003

(54) METHOD FOR FABRICATING A MICROCONTACT SPRING ON A SUBSTRATE

(75) Inventor: Alexander Ruf, Dresden (DE)

(73) Assignee: Infineon Technologies, AG, Munich (DE)

( * ) Notice: Subject to any disclaimer, the term of this patent is extended or adjusted under 35 U.S.C. 154(b) by 0 days.

(21) Appl. No.: 10/267,224

(22) Filed: Oct. 9, 2002

(65) Prior Publication Data

US 2003/0071351 A1 Apr. 17, 2003

(30) Foreign Application Priority Data

Oct. 9, 2001 (DE) .......................... 101 49 688

(51) Int. Cl.$^7$ .......................... H01L 21/00; H01L 21/46; H01L 21/78; H01L 21/301; H01L 21/44
(52) U.S. Cl. .......................... 438/50; 438/52; 438/461; 438/611; 438/638
(58) Field of Search .......................... 438/50, 52, 461, 438/611, 638

(56) References Cited

U.S. PATENT DOCUMENTS

| | | | |
|---|---|---|---|
| 5,543,013 A | * | 8/1996 | Tsang et al. .................. 438/52 |
| 5,930,596 A | | 7/1999 | Klose et al. .................. 438/98 |
| 2001/0001080 A1 | | 5/2001 | Eldridge et al. ............ 438/611 |

FOREIGN PATENT DOCUMENTS

| | | | |
|---|---|---|---|
| DE | 199 50 885 A1 | 4/2001 | |
| JP | 2001205599 A | * 7/2001 | ............. B81B/3/00 |
| WO | WO 99/05721 A1 | 2/1999 | |

* cited by examiner

Primary Examiner—Olik Chaudhuri
Assistant Examiner—William M. Brewster
(74) Attorney, Agent, or Firm—Jenkins, Wilson & Taylor, P.A.

(57) ABSTRACT

The invention relates to a method for fabricating a microcontact spring on a substrate (1) with at least one contact pad (2) and a first insulator layer (13) with a window above the contact pad (2).

In order to enable the cost-effective contact-connection or wiring of a plurality of silicon chips at the wafer level simultaneously, the method according to the invention comprises the steps of: a) producing a via opening (19) in a second insulator layer (16) above a location to be contact-connected; b) producing a depression (20) in the second insulator layer (16); c) filling the via opening (19) and the depression (20) in the second insulator layer (16) with a metal; d) leveling the surface produced by the preceding steps, so that excess metal and insulator material are removed; e) selectively etching back a first predetermined thickness of the second insulator layer (16), so that the second insulator layer (16) remains with a second predetermined thickness, so that a section of the via opening (19) is maintained and serves as mechanical retention for the resulting microcontact spring.

10 Claims, 4 Drawing Sheets

METHOD FOR FABRICATING A MICROCONTACT SPRING ON A SUBSTRATE

TECHNICAL FIELD

The invention relates to a method for fabricating a microcontact spring on a substrate, which can be used in particular for test connections to a semiconductor wafer.

BACKGROUND ART

Devices for realizing parallel contact-connection or wiring of silicon chips and test boards or printed circuit boards at the wafer level are known per se.

U.S. Pat. No. 6,184,053 discloses a method for fabricating microelectronic spring contact elements, in which at least one first layer made of metal is deposited in openings which are predetermined by masking layers on a surface of the substrate of, for example, an electronic component such as an active semiconductor component. Each spring element has a base end, a contact end and a central section. The contact end is offset in the z-direction (in height) and in the x- or y-direction relative to the base end. The method for fabricating a spring contact element on a substrate essentially comprises the steps of: depositing at least one first layer made of masking material on a surface of the substrate with openings for contact-connecting regions on the surface, depositing a layer made of a first conductive material, so that the openings are filled, restricting defined regions of the first conductive material, selectively depositing a second conductive material essentially above the defined regions of the first conductive material, and removing the first layer made of masking material, so that a self-supporting spring contact element made of the second conductive material remains.

In the case of this prior art, selectively depositing the second conductive material above the defined regions of the first conductive material proves to be difficult. Moreover, it is a dedicated method which cannot readily be incorporated in the present-day customary manufacturing sequence of semiconductor chips.

DE 198 53 445 discloses contact needles, for the fabrication of which the following steps are carried out: electrodeposition of the needle tips in the structures of a layer of resist material, electrodeposition of the spring clip attached to the needle tip in the structures of at least one further resist layer arranged on the first resist layer, and removal of the resist material. The resulting contact needle has an electrodeposited spring clip made of at least one first contact needle material and an electrodeposited needle tip made of at least one second contact material, which is arranged at an angle on the spring clip.

The method according to this prior art is optimized for oblique exposure and is thus restricted to a specific exposure geometry. Moreover, it likewise cannot readily be incorporated in the present-day customary manufacturing sequence of semiconductor chips.

A further prior art is the fabrication of so-called "soft bumps", which is investigated by various working groups worldwide. During the fabrication of the soft bumps, the resilient contact is realized by means of an elastic bump on which a metallic interconnect is situated. The disadvantage here is that the bump technology is unknown in silicon manufacturing and has to be adapted to the present-day customary manufacturing methods. Furthermore, in the event of temperature changes, the different expansion coefficients of bump and metallic interconnect cause mechanical stresses primarily in the metal interconnect, which lead to material fatigue.

SUMMARY OF THE INVENTION

It is an object of the invention to enable the cost-effective contact-connection or wiring of a plurality of silicon chips at the wafer level simultaneously.

This object is achieved by means of a method according to claim 1. The subclaims relate to preferred embodiments of the invention.

In the case of the solution according to the invention, a metal spring is realized by means of a dual damascene process. The dual damascene process is known per se in wafer manufacturing for fabricating Cu metalization tracks or Cu wirings. Therefore, it can readily be integrated into present-day customary manufacturing sequences in the fabrication of semiconductor chips.

The method according to the invention for fabricating a microcontact spring on a substrate with at least one contact pad and a first insulator layer with a window above the contact pad comprises the steps of: a) producing a via opening in a second insulator layer above a location to be contact-connected; b) producing a depression in the second insulator layer; c) filling the via opening and the depression in the second insulator layer with a metal; d) leveling the surface produced by the preceding steps, so that excess metal and insulator material are removed; e) selectively etching back a first predetermined thickness of the second insulator layer, so that the second insulator layer remains with a second predetermined thickness, so that a section of the via opening is maintained and serves as mechanical retention for the resulting microcontact spring.

In a first preferred embodiment, the location to be contact-connected is a contact pad. In an alternative preferred embodiment, a passivation layer is applied on the first insulator layer and a metallic connection is led out from the location to be contact-connected via the passivation layer in the lateral and transverse directions.

In order to improve the deposition of the metal and in order to prevent diffusion of metal into underlying layers, an electrodeposition start layer is preferably produced according to step b). In this case, the electrodeposition start layer may be constructed from at least two metal layers, a first layer being composed, in particular, of copper or nickel and a second layer serving as barrier and adhesion layer.

In particular, the leveling of excess metal and insulator material including the electrodeposition start layer is preferably effected by chemical mechanical polishing (CMP). The microcontact spring is uncovered in step e) preferably by means of an isotropic wet or dry etching step.

The second insulator layer may be a polyimide layer.

The production of a via opening in step a) is preferably carried out by means of photolithography with subsequent dry etching.

W or Ni is preferably used as metal for filling the via opening and the depression in the second insulator layer in step c).

One advantage of the invention is that no thermal stress arises in the microcontact spring, since it is a pure metal spring. A further advantage is that all the properties of the spring can be set through the choice of the method parameters: thus, the spring constant can be determined, the material can be chosen, the contact point of the spring can be predetermined, and the reproducibility during its fabrication is ensured. In particular, it is possible to fabricate springs with small base areas, and it is not necessary to lead a metalization to the passivation.

As already mentioned above, an essential feature of the invention is that known and cost-effective processes (oxide deposition, lithography, etching, CMP, PVD, microelectrodeposition) for silicon manufacturing, which can additionally be transferred to 300 mm wafers, are used and compatibility with methods employed nowadays is thus afforded.

BRIEF DESCRIPTION OF THE DRAWINGS

The invention is explained using preferred embodiments, reference being made to the accompanying drawings.

DETAILED DESCRIPTION OF THE INVENTION

Figure 1:
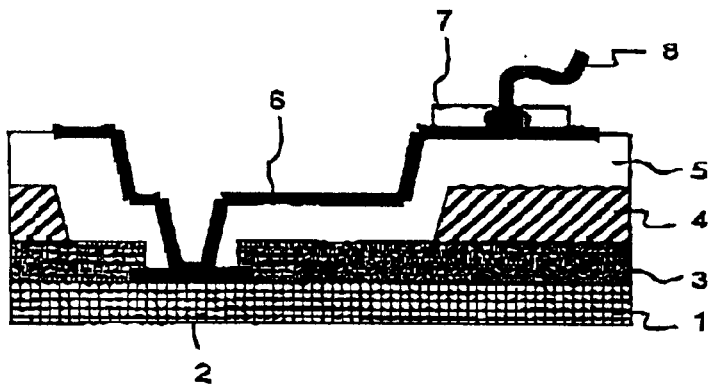
FIG. 1 shows a contact spring according to the prior arts.

FIG. 1 shows a spring made of wires. A contact area or pad 2, which is generally fabricated from Al, is situated on a semiconductor wafer 1. The contact area 2 is surrounded by a first insulator layer 3, generally an oxide layer, which has windows at the locations of the contact area 2. The pad 2 is contact-connected via these windows in the first insulator layer 3. To that end, a further window is defined by a second insulator layer 4 on the first insulator layer 3, a metal layer 5 being deposited in said further window. Finally, a Ti layer 6 is situated on the metal layer 5. The spring contact is fabricated with a wire 8, which is contact-connected on a connection area 7 with the metalization 5 and the Ti layer 6.

One disadvantage with this method is that although it is possible to work at the wafer level, each pad 2 must be individually contact-connected. That is expensive and complicated. By contrast, front-end processes of silicon manufacturing are used only to a limited extent in the prior art.

Figure 2:
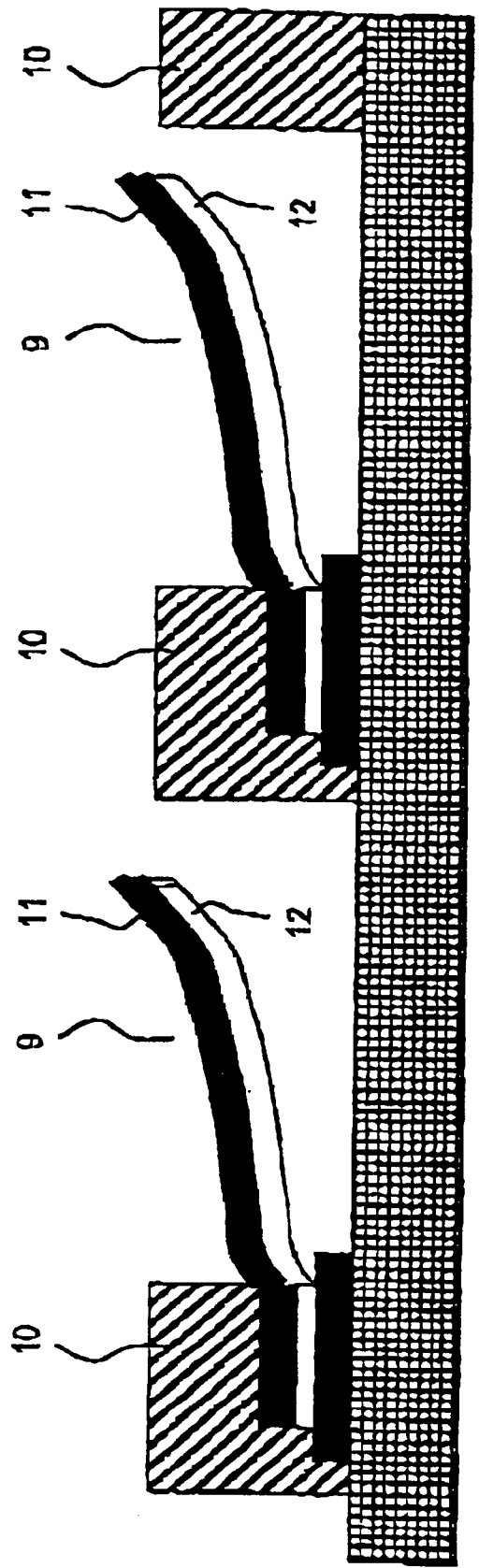
FIG. 2 shows a further contact spring according to the prior art.

A further example of a spring according to the prior art is shown in FIG. 2. The spring is fabricated by means of hot embossing or fine milling: the springs 9 end in so-called "compression stops" 10 situated directly on contact areas or pads For setting the spring stress, the springs 9 are composed of a first metal 11 and a second metal 12.

In this method, a plurality of springs can, be fabricated in parallel, although hot embossing and fine embossing are not processes which are routinely used in wafer manufacturing. Thus, as yet there is also no experience as to whether these processes are compatible with 300 mm wafers. Overall, the fabrication of the springs 9 with compression stops 10 is very complicated.

Figure 3A:
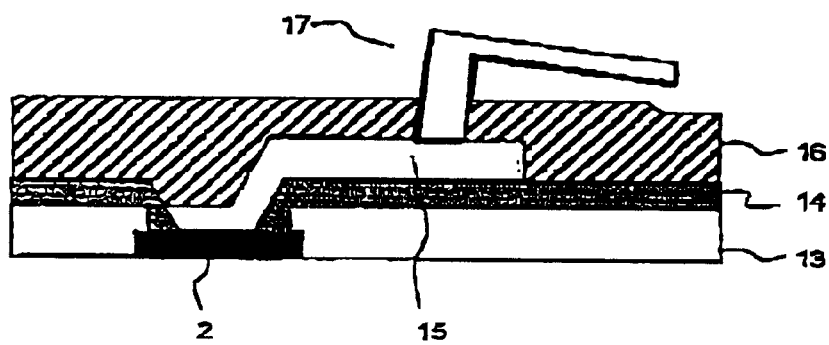
FIGS. 3A and 3B show two embodiments of the microcontact spring according to the present invention.
Figure 3B:
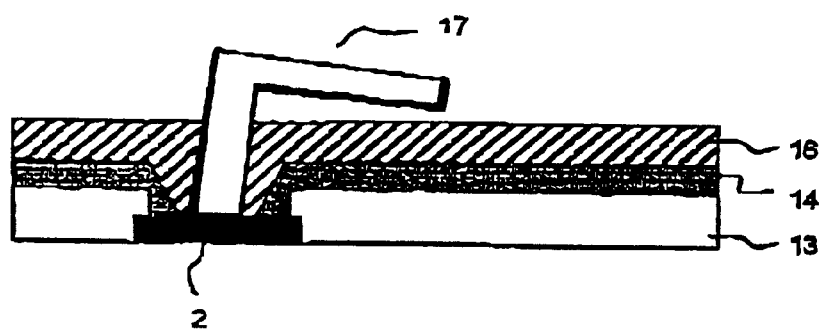

FIGS. 3A and 3B show microcontact springs which have been fabricated by the method according to the invention. FIG. 3A shows a microcontact spring with a metal track wiring to the passivation, and FIG. 3B shows a microcontact spring with a direct contact-connection of the contact area (pad).

In FIG. 3A, a first insulator layer 13 is produced on a substrate (not illustrated) with a contact pad 2 and a passivation layer 14, which is generally a silicon nitride layer, is deposited on said insulator layer. A connection 15 made of electrically conductive material (preferably Cu) is subsequently produced, by which to enable [sic] a contact-connection of the pad 2 from outside the passivation layer. A further insulator layer 16 is produced above it, which later covers and retains the foot of the microcontact spring 17 to be fabricated.

FIG. 3B shows a microcontact spring which is arranged directly on the pad 2, so that the connection 15 is obviated. Both in the exemplary embodiment according to FIG. 3A and in the exemplary embodiment according to FIG. 3B, the stresses occurring in the spring foot are taken up by the insulator layer 16 that is still present at the spring foot. The insulator layer 16 may be an oxide layer, an oxynitride layer, a polyimide layer or a photoresist layer.

The curvature of the spring 17 is brought about by the stress in the spring material or by the weight of the spring beam, which causes bending. The insulator layer 16 therefore serves as a mechanical anchoring and, at the same time, also as a flexure stop.

Figure 4A:
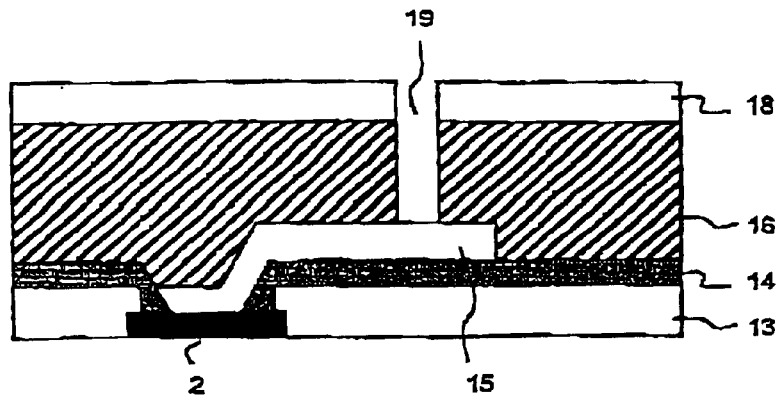
FIGS. 4A to 4G show the individual method steps according to the invention, FIGS. 4E, 4F and 4G showing different types of the resulting microcontact spring.

The method according to the invention is explained below with reference to the illustrations in FIGS. 4A to 4G. FIG. 4A shows a cross section through the construction on a substrate, in the case of which a photoresist 18 is deposited on the second insulator layer 16. In the case illustrated here, said photoresist serves to define a region in which a via opening 19 is produced in the second insulator layer 16. The via opening 19 is carried out in a generally known manner by means of photolithography with subsequent dry etching. The via opening 19 is then situated above a location to be contact-connected. In the case of the component shown in FIGS. 4A to 4G, said location to be contact-connected is not situated directly above the pad 2, but rather on the passivation layer 14 at a vertical and lateral distance from the pad 2. The connection 15 produces an electrical contact between the pad 2 and the location to be contact-connected.

Figure 4B:
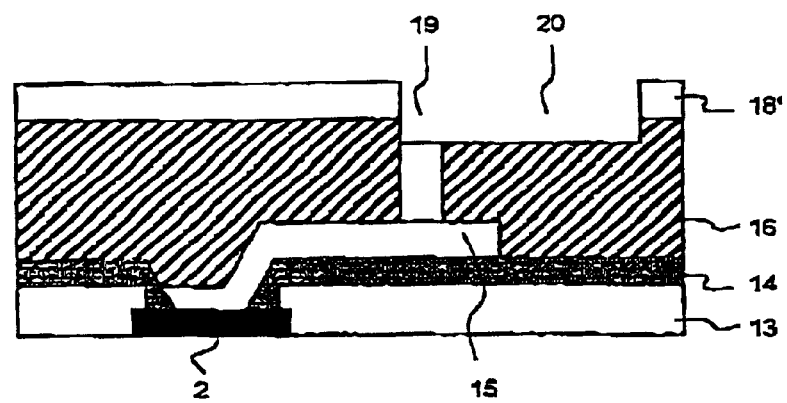

In the state of the component as shown in FIG. 4B, a region directly next to the via opening 19 has been defined with a photolayer 18'. In this region, a depression 20 is produced in the second insulator layer 16. In this case, the depression 19 is arranged in such a way that the upper part of the via opening 19 corresponds to a side section of the depression 20.

Figure 4C:
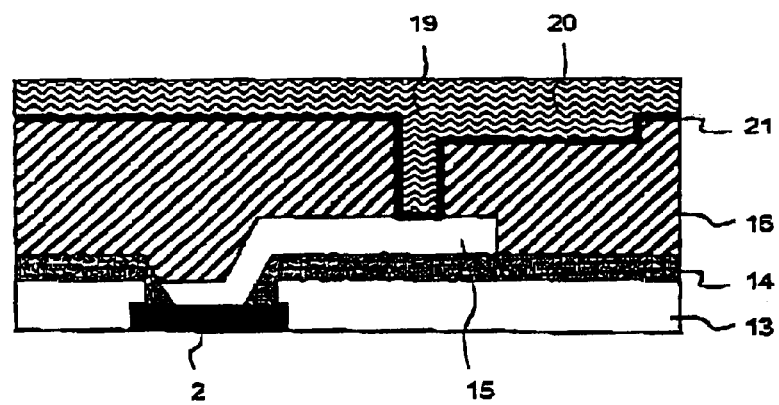

The photoresist layer 18' is removed, and the via opening 19 and the depression 20 in the second insulator layer 16 are filled with a metal. Thus, essentially the entire surface of the component is covered with metal in this stage of the manufacturing process. This state is shown in FIG. 4C. FIG. 4C additionally illustrates an electrodeposition start layer 21, which serves on the one hand to ensure the adhesion between metal and insulator or semiconductor, but on the other hand also prevents metal from diffusing into underlying layers. Therefore, in particular, the electrodeposition start layer 21 may be constructed from two material layers (not illustrated), the first layer being composed, in particular, of copper or nickel and a second layer serving as barrier and adhesion layer. As a result, both purposes mentioned are optimally achieved.

Figure 4D:
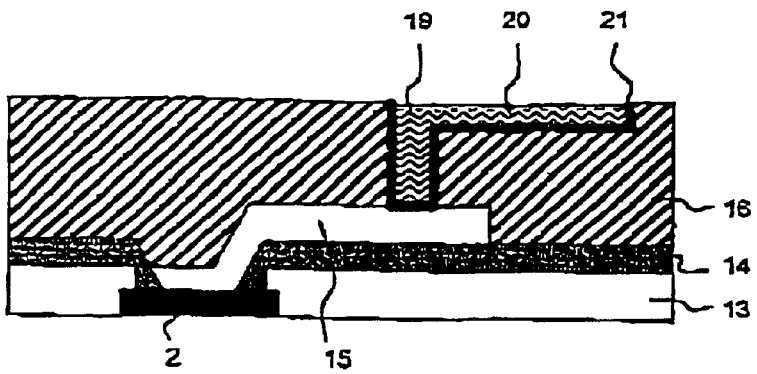

As shown in FIG. 4D, the component surface that has been produced by the preceding steps is leveled, so that excess metal and insulator material of the layer 16 are removed. As a result, a well is obtained at the surface of the component, said well being connected via a channel, namely the via opening 19, to the connection 15. The surface is preferably leveled by chemical mechanical polishing (CMP), but, in principle, said surface can also be leveled by isotropic plasma etching or wet etching.

In a further step, the second insulator layer 16 is selectively etched back, so that only a part of the second insulator layer 16 remains. This lower part of the insulator layer 16 has a predetermined thickness. The thickness is chosen such that, on the one hand, a beam 23 corresponding to the earlier depression 20 is uncovered on its underside and, on the other hand, a foot 22 corresponding to the section of the via opening 19 is maintained. The foot 22 serves as mechanical retention for the resulting microcontact spring. The insulator layer 16 is selectively etched back preferably by means of an isotropic wet or dry etching step.

The form of the beam 23 of the microcontact spring depends on parameters during the covering of the surface of the component in the step in FIG. 4C. As is known, e.g. from U.S. Pat. No. 6,184,699, it is possible to produce different bending moments in metal layers by altering the gas composition in the reaction chamber in the course of metal deposition, for example by sputtering. It is also equally possible to change the angle at which the metal is deposited, or it is possible to alter the pressure of the plasma gas, which is preferably argon. The changes can be effected continuously or in stages.

Figure 4E:
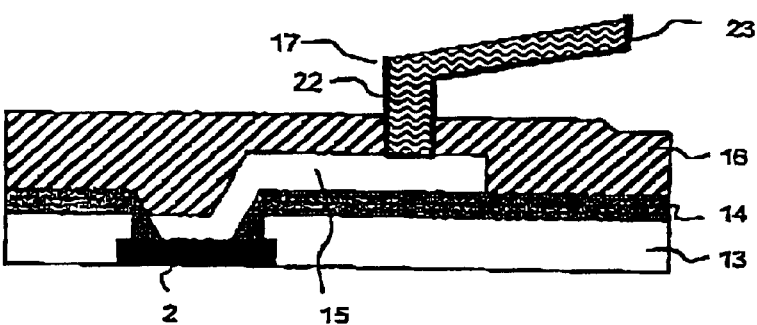
Figure 4F:
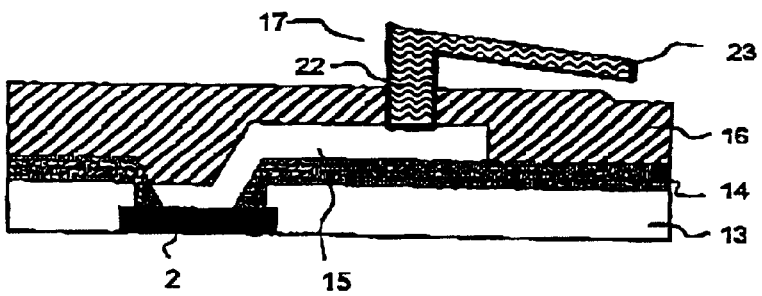

Accordingly, as a result of the last step, FIG. 4E shows a microcontact spring whose beam 23 points upward after being uncovered from the insulator 16. FIG. 4F shows a microcontact spring whose beam 23 points downward after the last step.

The contact point, i.e. the point at which the electrical contact to the microcontact spring is produced, is chosen depending on the orientation of the beam 23. In this case, the contact point is determined either in a targeted manner by way of the stress in the spring, a bimetal effect or a deliberately engendered bend.

In the embodiment according to FIG. 4E, the contact point is the free end of the beam 23. In the embodiment according to FIG. 4F, the contact point is the end of the beam at which it is connected to the foot 22 of the microcontact spring.

Figure 4G:
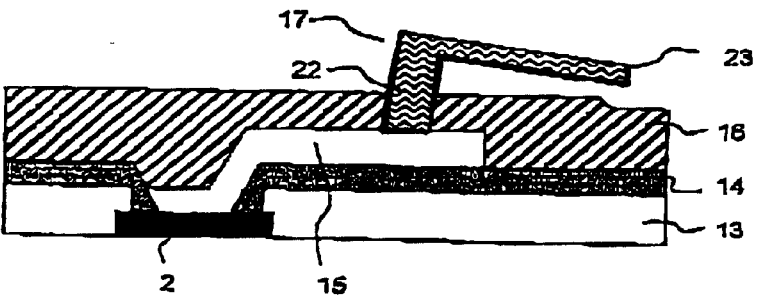

Finally, FIG. 4G shows the case where the orientation of the beam 23 is governed by its inherent weight. In this case, too, the contact point lies at the end of the beam at which the beam 23 is connected to the foot 22 of the microcontact spring.

The method according to the invention can be summarized in the following steps:

a) once the metallic wiring from the pad to the passivation is present, an oxide layer is applied and the negative form of the spring foot is realized in the latter by means of a photolithography step with subsequent dry etching.

b) After the removal of the first resist layer, a new resist layer is applied and patterned by means of photolithography in such a way that the negative form of the spring beam can be realized in the oxide by means of a dry oxide process. In this case, the negative form of the foot is filled with resist in order that the underlying metal track is not damaged during the dry etching.

c) After the removal of the photoresist layer, an electrodeposition start layer is applied by means of a PVD method this layer may be constructed from different metals, one layer performing a barrier and adhesion function, while a second layer, e.g. made of copper or nickel, constitutes the actual start layer.

d) The negative form of the spring (foot and beam) is filled metallically by means of the metallic contact of the start layer as cathode.

e) The excess metal including the start layer and possible adhesion and barrier layers is removed by means of a CMP step.

f) The springs are uncovered by an isotropic wet or dry etching step, so that the foot still remains covered and functions as mechanical retention.

The spring constant of the microcontact spring thus fabricated can be calculated from the following relationship:

$$k = \frac{3E\pi d^4}{64L^3}$$

where d is the diameter given a round cross section of the spring beam, L is the height of the microcontact spring and E is the modulus of elasticity, which is 225 Gpa for nickel. Nickel can be deposited particularly well, but W can likewise be used, which can be deposited after the production of a thin TiN adhesion layer by means of CVD. Thus, by way of example, in the case of a microcontact spring where d=50 $\mu$m and L=815 $\mu$m, a spring constant of approximately 410 Nm is achieved. In the case of a microcontact spring where d=1.1 $\mu$m and L=5 $\mu$m, a spring constant of approximately 420 Nm is achieved, the aspect ratio that can be fabricated being 5.

Thus, for the first time a contact spring has been realized by means of a dual damascene process.

Reference Symbols

1 Wafer
2 Contact pad
3 First insulator with pad opening
4 Second insulator with contact window
5 Metalization
6 Ti layer (?)
7 Connection area
8 Wire
9 Spring
10 Compression stop
11 First spring metal
12 Second spring metal
13 First oxide layer
14 Silicon nitride layer
15 Copper-filled connection
16 Second oxide layer
17 Contact element
18 First photoresist layer, 18' Second photoresist layer
19 Via opening
20 Depression
21 Start layer for electrodeposition
22 Foot of the microcontact spring
23 Beam of the microcontact spring

What is claimed is:

1. Method for fabricating a microcontact spring on a substrate with at least one contact pad and a first insulator layer with a window above the contact pad, which comprises the steps of:

a) producing a via opening in a second insulator layer above a location to be contact-connected;

b) producing a depression in the second insulator layer;

c) filling the via opening and the depression in the second insulator layer with a metal;

d) leveling the surface produced by the preceding steps, so that excess metal and insulator material are removed;

e) selectively etching back a first predetermined thickness of the second insulator layer, so that the second insulator layer remains with a second predetermined thickness, so that a section of the via opening is maintained and serves as mechanical retention for the resulting microcontact spring.

2. Method according to claim 1, wherein the location to be contact-connected is a contact pad.

3. Method according to claim 1, wherein a passivation layer is applied on the first insulator layer and a metallic connection is led out from the location to be contact-connected via the passivation layer in the lateral and transverse directions.

4. Method according to claim 1, wherein an electrodeposition start layer is produced according to step b).

5. Method according to claim 4, wherein the electrodeposition start layer is constructed from at least two metal layers, a first layer being composed, in particular, of copper or nickel and a second layer serving as barrier and adhesion layer.

6. Method according to claim 1, wherein the leveling of excess metal and insulator material including the electrodeposition start layer is effected by CMP.

7. Method according to claim 1, wherein the microcontact spring is uncovered in step e) by means of an isotropic wet or dry etching step.

8. Method according to claim 1, wherein the second insulator layer is a polyimide layer.

9. Method according to claim 1, wherein step a) is carried out by means of photolithography with subsequent dry etching.

10. Method according to claim 1, wherein the metal in step c) is W or Ni.

* * * * *